US012775766B1

(12) United States Patent
Saxena

(10) Patent No.: US 12,775,766 B1
(45) Date of Patent: Oct. 27, 2026

(54) LOCALIZATION OF LOGIC CONTAINING INSTRUMENTATION IN CIRCUIT EMULATION

(71) Applicant: Synopsys, Inc., Sunnyvale, CA (US)

(72) Inventor: Prashant Saxena, Portland, OR (US)

(73) Assignee: Synopsys, Inc., Sunnyvale, CA (US)

(*) Notice: Subject to any disclaimer, the term of this patent is extended or adjusted under 35 U.S.C. 154(b) by 803 days.

(21) Appl. No.: 18/121,410

(22) Filed: Mar. 14, 2023

Related U.S. Application Data

(60) Provisional application No. 63/402,009, filed on Aug. 29, 2022.

(51) Int. Cl.

*G06F 30/33* (2020.01)
*G06F 30/3312* (2020.01)
*G06F 30/34* (2020.01)
*G06F 30/367* (2020.01)
*G06F 30/392* (2020.01)
*G06F 30/398* (2020.01)

(52) U.S. Cl.

CPC ............ *G06F 30/33* (2020.01); *G06F 30/392* (2020.01); *G06F 30/3312* (2020.01); *G06F 30/34* (2020.01); *G06F 30/367* (2020.01); *G06F 30/398* (2020.01)

(58) Field of Classification Search

CPC .... G06F 30/33; G06F 30/392; G06F 30/3312; G06F 30/34; G06F 30/367; G06F 30/398

USPC .... 716/108, 105, 113, 117, 136; 703/16, 17, 703/20

See application file for complete search history.

(56) References Cited

U.S. PATENT DOCUMENTS 5,729,466 A * 3/1998 Bamji ..................... G06F 30/30 716/135
5,909,376 A * 6/1999 Scepanovic ........... G06F 30/392 716/135
6,327,694 B1 * 12/2001 Kanazawa ............ G06F 30/392 716/135

(Continued)

OTHER PUBLICATIONS

Lou et al., "Concurrent Logic Restructuring and Placement for TIming Closure", IEEE, 1999, 5 pages. (Year: 1999).*

(Continued)

*Primary Examiner* — Phallaka Kik
(74) *Attorney, Agent, or Firm* — WOMBLE BOND DICKINSON (US) LLP

(57) ABSTRACT

A method includes: receiving a representation of a circuit design; grouping combinational logic portions of the circuit design into clusters corresponding to circuit portions of the circuit design; constructing a timing graph based on timing arcs through the clusters; determining, by a processing device, one or more partitions from among partitions of an emulation system to place a cluster of the circuit design based on reducing a placement cost associated with the cluster; and placing a circuit portion corresponding to the cluster in the partition of the plurality of partitions of the emulation system to emulate a circuit in accordance with the circuit design. In some embodiments, the method includes computing, for each cluster including a hybrid pin: a propagating cost based on propagating costs of fanin clusters for which the hybrid pin acts as a timing through-point; and a local cost based on propagating costs of all fanin clusters.

19 Claims, 11 Drawing Sheets

(56) References Cited

U.S. PATENT DOCUMENTS

| | | | | |
|---|---|---|---|---|
| 6,408,424 | B1 * | 6/2002 | Mukherjee | G01R 31/318392 716/106 |
| 6,698,006 | B1 * | 2/2004 | Srinivasan | G06F 30/396 716/122 |
| 6,701,506 | B1 * | 3/2004 | Srinivasan | G06F 30/327 716/122 |
| 6,701,507 | B1 * | 3/2004 | Srinivasan | G06F 30/39 327/295 |
| 6,754,877 | B1 * | 6/2004 | Srinivasan | G06F 30/39 716/134 |
| 7,092,858 | B1 * | 8/2006 | Kukula | G06F 30/33 717/124 |
| 7,620,927 | B1 * | 11/2009 | Ochotta | G06F 30/347 716/105 |
| 7,725,868 | B1 * | 5/2010 | Verma | H10D 89/10 716/128 |
| 8,219,957 | B1 * | 7/2012 | Gaitonde | G06F 30/392 716/119 |
| 8,478,878 | B2 * | 7/2013 | Freimuth | G06F 9/45558 718/1 |
| 8,549,448 | B2 * | 10/2013 | Vuillod | G06F 30/33 716/113 |
| 8,578,321 | B2 * | 11/2013 | Lyer | G06F 30/3312 716/135 |
| 8,935,642 | B1 * | 1/2015 | Bhardwaj | G06F 30/30 716/108 |
| 9,152,742 | B1 * | 10/2015 | Gupta | G06F 30/3315 |
| 10,878,154 | B1 * | 12/2020 | Badaoui | G06F 30/3312 |
| 12,423,578 | B1 * | 9/2025 | Zheng | G06N 3/063 |
| 2006/0190899 | A1 * | 8/2006 | Migatz | G06F 30/39 716/114 |
| 2007/0245281 | A1 * | 10/2007 | Riepe | G06F 30/392 716/120 |
| 2017/0068765 | A1 * | 3/2017 | Sinnadurai | G06F 30/398 |
| 2017/0364621 | A1 * | 12/2017 | Lepercq | G06F 30/367 |
| 2018/0165400 | A1 * | 6/2018 | Feld | G06F 30/18 |
| 2020/0057836 | A1 * | 2/2020 | Xiang | G06F 30/392 |
| 2023/0376659 | A1 * | 11/2023 | Lu | G06F 30/27 |

OTHER PUBLICATIONS

Mangiras et al., "Timing-Driven Placement Optimization Facilated by Timing-Compatibility Flip-Flop Clustering", IEE Transactions on Computer-Aided Design of Integrated Circuit and Systems, 2019, 14 pages. (Year: 2019).*

Marquardt et al., "Using Cluster-Based Logic Blocks and TIming-Driven Packing to Improve FPGA Speed and Density", ACM, 1999, pp. 37-46. (Year: 1999).*

Yan et al., "An Effective Floorplan-Guided Placement Algorithm for Large-Scale Mixed-Size Designs", ACN Trans. Des. Autom. System., 19, 3, Article 29, Jun. 2014, 25 pages. (Year: 2014).*

* cited by examiner

LOCALIZATION OF LOGIC CONTAINING INSTRUMENTATION IN CIRCUIT EMULATION

RELATED APPLICATION

This application claims the benefit of U.S. Provisional Patent Application No. 63/402,009 "Localization of Logic Containing Instrumentation in Circuit Emulation," filed in the United States Patent and Trademark Office on Aug. 29, 2022, the entire disclosure of which is incorporated by reference herein.

TECHNICAL FIELD

The present disclosure relates to electronic design automation, namely the partitioning of integrated circuit designs for emulation and placement of logic elements into partitions.

BACKGROUND

Modern designs for integrated circuits such as systems-on-a-chip (SoC), digital signal processors, graphics accelerators, neural network processing accelerators, specialized hardware controllers, and the like are highly complex and may include hundreds of millions to tens of billions of transistors.

Integrated circuit designs are typically verified through testing processes to confirm that the designs operate according to their specifications and to detect and correct errors in those designs. Some approaches to verification include simulating the operation of the circuit design using a computer system running simulation software that simulates the propagation of input signals (e.g., a suite of test inputs) through a design to confirm that the outputs of the design match the expected results. Some other approaches to verification include emulating the operation of the circuit using reconfigurable hardware, typically in the form of one or more field programmable gate arrays (FPGAs) that are configured to implement the integrated circuit design.

The above information disclosed in this Background section is only for enhancement of understanding of the present disclosure, and therefore it may contain information that does not form the prior art that is already known to a person of ordinary skill in the art.

SUMMARY

According to one embodiment of the present disclosure, a method includes: receiving a representation of a circuit design; grouping combinational logic portions of the circuit design into clusters corresponding to circuit portions of the circuit design; constructing a timing graph based on timing arcs through the clusters; computing, for each cluster of the clusters including a hybrid pin that behaves as a timing endpoint and a timing through-point along different paths in the circuit design: a propagating cost computed based on propagating costs of fanin clusters for which the hybrid pin acts as a timing through-point; and a local cost computed based on propagating costs of all of the fanin clusters; determining, by a processing device, one or more partitions from among a plurality of partitions of an emulation system to place a cluster of the circuit design based on reducing a placement cost associated with the cluster, the placement cost of each cluster including a hybrid pin being computed based on the local cost associated with the cluster; and placing a circuit portion corresponding to the cluster in the partition of the plurality of partitions of the emulation system to emulate a circuit in accordance with the circuit design.

The determining the partition from among the plurality of partitions includes computing a cost of placing the cluster in each of the plurality of partitions based on the costs of placing a plurality of fanin clusters to the cluster in the plurality of partitions, and the cost may be computed based on a plurality of costs of placing all of the fanin clusters to the cluster.

The circuit portion may include a hybrid pin that behaves as a timing endpoint and a timing through-point along different paths in the circuit design, and the method may further include: detecting a topological loop through the hybrid pin in the circuit design; creating a movable virtual endpoint at a terminating edge of the hybrid pin; and breaking the topological loop at the terminating edge.

The determining the partition from among the plurality of partitions may further include backtracing from a timing endpoint of the timing graph, and the method may further include: generating solutions for the movable virtual endpoint corresponding to the plurality of partitions; and selecting one or more solutions for the virtual endpoint corresponding to one or more partitions in which the hybrid pin is placed during the backtracing.

A cluster corresponding to the circuit portion may include a plurality of output nodes, and the determining the partition from among the plurality of partitions may include, for an output node of the output nodes of the cluster: determining logic elements of the cluster in a transitive fanin cone of the output node; and replicating the output node and the transitive fanin cone of the output node in the partition, without replicating logic elements of the cluster that are not in the transitive fanin cone of the output node in the partition.

The cluster may include a plurality of multi-cycle paths connected to an output of the cluster, and the determining the partition of the plurality of partitions to place the cluster may include pruning the cluster to be replicated in the partition of the plurality of partitions by: computing a plurality of multi-cycle path-normalized delays corresponding to the multi-cycle paths; determining one or more of: that a multi-cycle path-normalized delay of a multi-cycle path is less than a threshold fraction of a maximum multi-cycle path-normalized delay among the plurality of multi-cycle paths; or that a tightest multi-cycle path value is greater than a threshold multi-cycle path value; and pruning a node associated with the multi-cycle path from the cluster.

Each partition may be a field programmable gate array (FPGA), a board including a plurality of FPGAs, or a unit including a plurality of boards, each board including a plurality of FPGAs.

According to one embodiment of the present disclosure, a system includes: a memory storing instructions; and a processing device, coupled with the memory and to execute the instructions, the instructions when executed cause the processing device to: receive a representation of a circuit design; determine one or more partitions from among a plurality of partitions of an emulation system to place a circuit portion of a plurality of circuit portions of the circuit design, the circuit portion including a hybrid pin that behaves as a timing endpoint and a timing through-point along different paths in the circuit design; and implement the circuit portion in the partition of the plurality of partitions of the emulation system to emulate a circuit in accordance with the circuit design.

The memory may further store instructions that, when executed by the processing device, cause the processing device to: compute a cost of placing the circuit portion in each of the plurality of partitions based on the costs of placing a plurality of fanin circuit portions to the circuit portion in the plurality of partitions, the cost may be computed based on a plurality of costs of placing all of the fanin circuit portions to the circuit portion in the plurality of partitions.

The memory may further store instructions that, when executed by the processing device, cause the processing device to compute a propagating cost based on a plurality of costs of placing only fanin circuit portions where the hybrid pin is a timing through-point in the plurality of partitions.

The memory may further store instructions that, when executed by the processing device, cause the processing device to: detect a topological loop through the hybrid pin in the circuit design; create a movable virtual endpoint at a terminating edge of the hybrid pin; and break the topological loop at the terminating edge.

The instructions for determining the partition from among the plurality of partitions may further include instructions to backtrace from a timing endpoint of a timing graph based on timing arcs through the circuit design, and the memory may further store instructions that, when executed by the processing device, cause the processing device to: generate solutions for the movable virtual endpoint corresponding to the plurality of partitions; and select one or more solutions corresponding to one or more partitions in which the hybrid pin is placed during the backtrace.

The memory may further store instructions that, when executed by the processing device, cause the processing device to: group combinational logic portions of the circuit design into clusters corresponding to the circuit portions of the circuit design; and construct a timing graph based on timing arcs through the clusters, the instructions to determine one or more partitions from among the plurality of partitions of an emulation system to place a circuit portion of the circuit design may include instructions that, when executed by the processing device, cause the processing device to compute a placement cost associated with the cluster based on the timing graph.

Each partition may be a field programmable gate array (FPGA), a board including a plurality of FPGAs, or a unit including a plurality of boards, each board including a plurality of FPGAs.

According to one embodiment of the present disclosure, a non-transitory computer readable medium includes stored instructions, which when executed by a processing device, cause the processing device to: receive a representation of a circuit design; group combinational logic portions of the circuit design into clusters corresponding to circuit portions of the circuit design; construct a timing graph based on timing arcs through the clusters; determine one or more partitions from among a plurality of partitions of an emulation system to place a cluster of the clusters of the circuit design based on reducing a placement cost associated with the cluster; and place a circuit portion corresponding to the cluster in the partition of the plurality of partitions of the emulation system to emulate a circuit in accordance with the circuit design.

The non-transitory computer readable medium may further include stored instructions, which when executed by the processing device, cause the processing device to compute a cost of placing the cluster in each of the plurality of partitions based on the costs of placing a plurality of fanin clusters to the cluster in the plurality of partitions.

A circuit portion corresponding to the cluster may include a hybrid pin that behaves as a timing endpoint and a timing through-point along different paths in the circuit design, the non-transitory computer readable medium may further include stored instructions, which when executed by the processing device, cause the processing device to compute, for each cluster: a propagating cost computed based on propagating costs of fanin clusters for which the hybrid pin acts as a timing through-point; and a local cost computed based on propagating costs of all of the fanin clusters, and wherein the placement cost associated with the cluster is computed based on the local cost.

A circuit portion corresponding to the cluster may include a hybrid pin that behaves as a timing endpoint and a timing through-point along different paths in the circuit design, and the non-transitory computer readable medium may further include stored instructions, which when executed by the processing device, cause the processing device to: detect a topological loop through the hybrid pin in the circuit design; create a movable virtual endpoint at a terminating edge of the hybrid pin; and break the topological loop at the terminating edge.

The instructions for determining the partition from among the plurality of partitions may further include instructions to backtrace from a timing endpoint of the timing graph, and the non-transitory computer-readable medium may further store instructions that, when executed by the processing device, cause the processing device to: generate solutions for the movable virtual endpoint corresponding to the plurality of partitions; and select one or more solutions corresponding to one or more partitions in which the hybrid pin is placed during the backtrace.

A cluster corresponding to the circuit portion may include a plurality of output nodes, and the non-transitory computer readable medium may further include stored instructions, which when executed by the processing device, cause the processing device to: determine a transitive fanin cone of the output node, the transitive fanin cone including combinational logic elements of the cluster; and replicate the output node and the transitive fanin cone of the output node in the partition, without replicating combinational logic elements of the cluster that are not in the transitive fanin cone of the output node in the partition.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
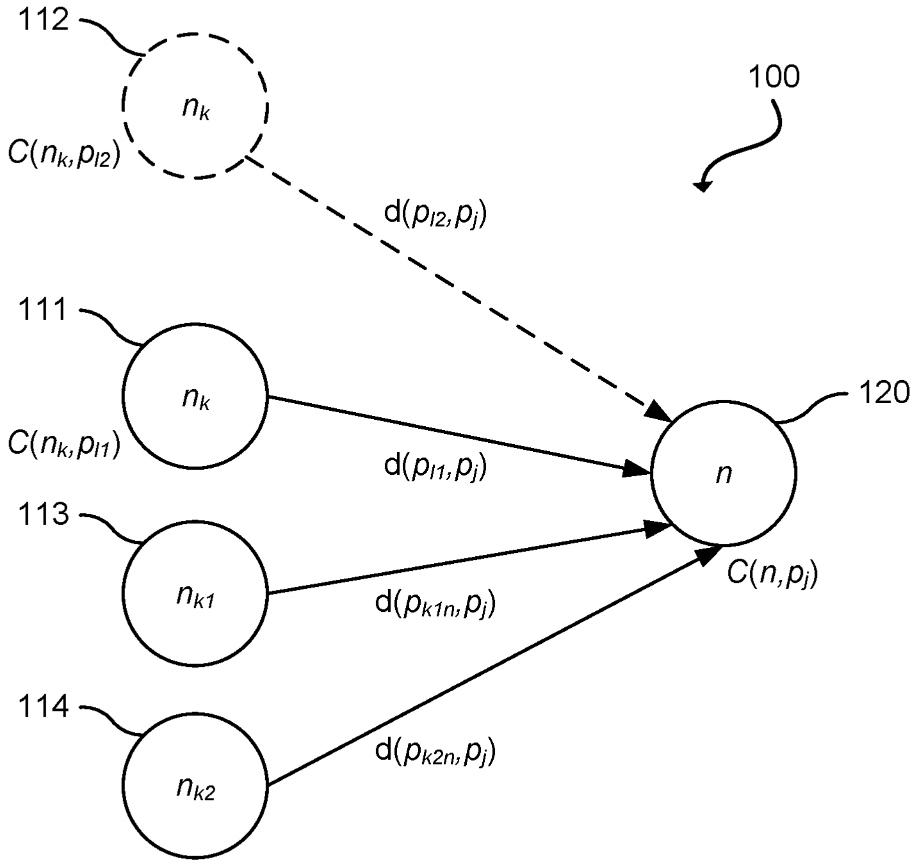
FIG. 1 depicts the computation of a cost of placing a node in a partition (or placement cost) using a dynamic programming technique.

Aspects of the present disclosure relate to localization of logic containing instrumentation in circuit emulation. Integrated circuit designs are typically verified through testing processes to confirm that the designs operate according to their specifications. These tests may identify errors in the behavior of the integrated circuit designs and error reports are provided as feedback to circuit designers to revise the integrated circuit designs such that they behave correctly. Two types of errors include logical errors (e.g., the integrated circuit produces the wrong result) and timing errors (e.g., the integrated circuit generates signals that arrive too early or too late).

Some approaches to verification include simulating the operation of the circuit design using a computer software that simulates the propagation of input signals (e.g., a suite of test inputs) through a design to confirm that the outputs of the design match the expected results. These software simulations may be constrained by the clock speeds of the computer processors running the simulations and the available memory on these computer systems, such that simulations may take days or weeks to run to simulate the operation of the integrated circuit for less than one second simulated time.

Other approaches to verification include emulating the operation of the circuit design using special purpose hardware, which greatly reduces the time to run a test suite in comparison to simulating the circuit design using software, with a tradeoff of higher costs due to the use of highly specialized hardware, rather than a computer system. One example of specialized hardware that can be used for emulating an integrated circuit is a field programmable gate array (FPGA). An FPGA is an electrical circuit that can be reprogrammed or reconfigured to implement different digital circuits by setting the values of lookup tables (LUTs) within the FPGA to implement various mathematical functions (e.g., to implement combinational logic gates) and by the setting the connections between the elements (e.g., LUTs, gates, memory, and fixed sub-circuits such as digital signal processors) within the FPGA. Accordingly, an FPGA, or collection of multiple FPGAs, can be configured to emulate a circuit design of a device to be tested.

In more detail, designs for large integrated circuits such as system-on-chip (SoC) designs may require hundreds of millions of LUTs to emulate. However, an individual FPGA may include, for example, about five to ten million LUTs. As a result, when the design of the integrated circuit is large, the emulated integrated circuit design may be spread across multiple FPGAs in the hardware emulation system. The multiple FPGAs may communicate with each other over communications busses. For example, multiple FPGAs may be located on a single printed circuit board (PCB) and communicate via intra-board busses, while FPGAs located on different boards (different PCBs) may communicate through inter-board busses.

The operation of the hardware emulation system may be controlled by a host computer system, which, in some embodiments, runs a piece of software referred to as an emulation compiler. An emulation compiler takes a representation of an integrated circuit design, such as a netlist, and generates a collection of instructions (referred to as bitfiles) for programming the individual FPGAs in the emulation system such that FPGAs programmed based on those bitfiles emulate the operation of the integrated circuit according to the received design. Part of the compilation process that is performed by the emulation compiler includes partitioning the integrated circuit design into separate partitions, where each partition is emulated by a different FPGA of the emulation system. The partitioning may be performed hierarchically, such as where several related partitions (e.g., corresponding to a subsystem within the integrated circuit design) are grouped together and placed on FPGAs on the same board, whereas different subsystems may be placed on different boards.

The highest speed at which an integrated circuit (IC) design can be emulated is often limited by paths that span multiple partitions in the emulator system (e.g., individual FPGAs, boards having multiple FPGAs, or units including multiple boards), because partition crossings (e.g., communications between two different FPGAs) tend to be more expensive in terms of delay than intra-partition logic (e.g., communications within an FPGA). In more detail, a single FPGA may have a limited number of input/output (I/O) pins (e.g., on the order of thousands of input/output pins or electrical connections) for communicating with other circuits outside of the FPGA, such as other FPGAs on the same board and the host computer system. Similarly, a board containing multiple FPGAs has a limited number of input/output pins for communicating with other boards. The number of input/output pins at various levels of the emulation system (e.g., at the FPGA level and at the board level) is generally not sufficient to transmit and receive all of the signals between different FPGAs in parallel (e.g., there may be tens of thousands of signals to be transmitted between partitions emulated by FPGAs), and therefore multiplexers are typically included at the inputs and outputs of the FPGAs to transmit and receive the signals in series through the limited number of pins (e.g., where signals take turns being transmitted through the shared pins, instead of being transmitted at the same time through different pins). The multiplexing of the signals and the interconnect wiring between the FPGAs (e.g., intra-board interconnect between FPGAs on the same board and inter-board interconnect between different boards) therefore introduce substantial delays.

For example, a first partition of the full integrated circuit design may transmit signals to a second partition of the integrated circuit design. In a real circuit, these signals would be transmitted directly from circuit elements of the first partition into the second partition. However, when emulating the operation of the integrated circuit design using FPGAs, the first partition and the second partition may be implemented on different FPGAs, so those signals must queue up to be transmitted between the FPGAs using output and input multiplexers at the output and input of those FPGAs. The multiplexers introduce delays such that the emulation system cannot continue emulating the operation of the integrated circuit design until all of the signals for a given clock cycle have been received by the FPGA that is emulating the second partition of the integrated circuit design. Depending on the number of signals that need to be transferred in this way, the delays can become quite large, thereby increasing the overall time needed to perform any given test run using the emulation system.

Therefore, when compiling an input integrated circuit design (e.g., as represented by a netlist) into, for example, bitfiles for programming individual FPGAs of the emulator system to emulate the integrated circuit design, an emulation compiler uses localization algorithms to relocate or replicate circuit elements of the integrated circuit design into different partitions to reduce or eliminate unnecessary partition crossings in long paths.

Some approaches to performance-based localization use dynamic programming techniques that generally operate as follows: given an integrated circuit design (e.g., represented as a netlist) partitioned into separate emulation hardware (e.g., different FPGAs), the process extracts a directed acyclic graph (DAG) representing this netlist, where the nodes are sorted in topological order by combinational logic depth (e.g., depth from an input port), the computer system running the emulation compiler performs the following operations:

- For each level l of the DAG in increasing order of topological depth,
  - For each node n in level l (e.g., each node in level l being l steps from an input port) and for each partition $p_j$ among the partitions of the circuit,
    - Determine the best way to place n in $p_j$.
- Backtrace the optimal solution (placements of the nodes in the partitions) starting from endpoints (e.g., the deepest levels or leaves of the DAG).

Determining the best way to place node n in partition $p_j$ involves reusing the optimal solutions for the fanin nodes (say, $n_k$) of n, computed during previous iterations of the loop (e.g., for lower levels in the DAG), as follows:

$$\text{cost}(n, p_j) = \max_{\{n_k \text{ in } fanin(n)\}}\left\{\min_{p_l}\{\text{cost}(n_k, p_l) + d(p_l, p_j)\}\right\} \quad \text{Eq. (1)}$$

where cost (x, y) is the optimum way of placing the fanin cone of node x when x is placed in partition y (e.g., the placement cost of node x in partition y), and $d(p_1, p_2)$ is the crossing delay from partition $p_1$ to partition $p_2$. Processing the nodes in increasing order of topological depth ensures that the optimal solutions for the fanin nodes have already been calculated and can therefore be looked-up instead of newly computed. This technique supports replication of nodes (e.g., placing nodes in multiple partitions) and relocation (moving nodes between partitions) within the same framework.

Advantages of the present disclosure include, but are not limited to, improving the performance of emulation hardware such as field programmable gate arrays (FGPAs) emulating the operation of integrated circuit designs. In more detail, some aspects of embodiments of the present disclosure relate to reducing or minimizing the delays associated with transferring signals across relatively low-bandwidth connections between different pieces of emulation hardware, thereby reducing the time needed to run tests of the integrated circuit design using the hardware emulation system. This reduced time shortens the feedback loop for engineers working to verify that the integrated circuit design operates according to specification so that more errors in the design can be caught and fixed within the budgeted time.

FIG. 1 depicts the computation of a cost of placing a node in a partition (or placement cost of the node) using a dynamic programming technique, in more detail the cost of placing node n in a particular partition p; when considering a portion of the directed acyclic graph 100 representing the netlist of the integrated circuit design. Considering one fanin node $n_k$ 111 among the fanin nodes to node n 120 (fanin(n)), there was a previously computed optimal cost of placing node $n_k$ in each of the partitions, denoted as $C(n_k, p)$. In some embodiments, the primary input node of the directed acyclic graph (e.g., an input port of the netlist) is assumed to have a placement cost of 0, as it has no fanin nodes to consider. Considering one such partition as $p_{l1}$ that associated optimal cost is $C(n_k, p_{l1})$. There is also a crossing delay $d(p_{l1}, p_j)$ associated with crossing from partition $p_{l1}$ to partition $p_j$. The delay $d(p_{l1}, p_j)$ may differ based on whether the partitions are in different FPGAs on different boards, different FPGAs on the same board, or if they are the same partition (e.g., where $p_{l1}=p_j$). In some embodiments, the delay $d(p_{l1}, p_j)$ is modeled as being zero when $p_{l1}=p_j$ because the delays associated with crossing between different FPGAs and crossing between different boards is much larger than the delay within an FPGA. FIG. 1 further depicts the possibility that node $n_k$ 112 could be placed in another partition, $p_{l2}$, where placement in partition $p_{l2}$ has a corresponding optimal cost $C(n_k, p_{l2})$ and corresponding crossing delay $d(p_{l2}, p_j)$.

While FIG. 1 only shows two possible placements of one fanin node $n_k$ in a first partition $p_{l1}$ or in a second partition $p_{l2}$, embodiments of the present disclosure are not limited thereto and the fanin node $n_k$ can be placed in any of the partitions (e.g., where the number of available partitions is set based on, for example, the number of FPGAs available in the emulation system and/or the number of boards available in the emulation system). In addition, while one fanin node $n_k$ was discussed above, embodiments of the present disclosure are not limited thereto, and may include more than one fanin node to the current node n, shown in FIG. 1 as additional fanin nodes $n_{k1}$ 113 and $n_{k2}$ 114.

Referring back to Equation 1, the optimal cost for placing node n 120 in each partition p (or optimal placement cost for node n in each partition p) is computed based on the maximum cost C from among the fanin nodes (e.g., fanin node $n_k$ 111, and additional fanin nodes $n_{k1}$ 113 and $n_{k2}$ 114) to node n when those fanin nodes are placed in the partition that minimizes their cost into node n (as indicated by partition $p_{k1n}$ as the partition where placement of node $n_{k1}$ in partition $p_{k1n}$ minimizes the cost C for paths coming via $n_{k1}$ into node n, and partition $p_{k2n}$ is the partition where the placement of node $n_{k2}$ in partition $p_{k2n}$ minimizes the cost C for paths coming via $n_{k2}$ into node n).

Figure 2:
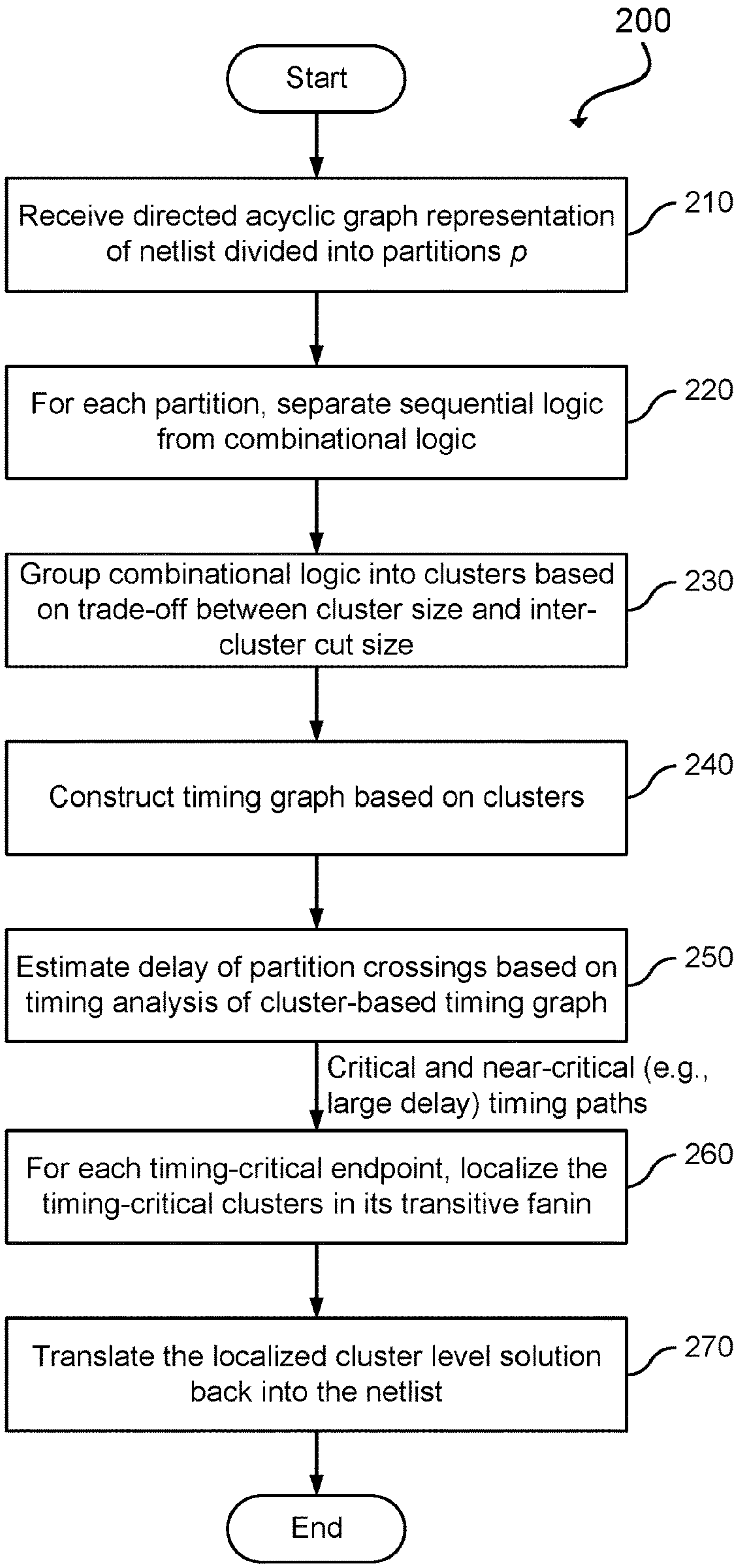
FIG. 2 is a flowchart of a method for computing the placement of logic clusters in partitions for emulation according to one embodiment of the present disclosure.

Some aspects of the present disclosure relate to extending the dynamic programming algorithm described above to support clusters of logic elements (e.g., clusters of logic gates). FIG. 2 is a flowchart of a method 200 for computing the relocation and/or replication of logic clusters in partitions for emulation according to one embodiment of the present disclosure. In some examples of the present disclosure, a computer system having a memory stores program instructions that, when executed by a processor of the computer system, performs the method 200. The computer system may include a cluster of multiple computer systems, such that the method is distributed across multiple devices. One example of a computer system is described below with respect to FIG. 10.

At 210, the computer system receives the directed acyclic graph (DAG) representation of the netlist corresponding to the integrated circuit design, where the graph is divided into partitions. At 220, starting with the contents of each partition p, the sequential logic (e.g., a type of logic circuit whose output depends on the present value of its input signals and on a sequence of past inputs, such as a latch, register, or other memory) and hybrid clusters that include both sequential and combinational logic, are separated from the purely combinational logic (e.g., a type of logic circuit whose output depends only on its current inputs, such as Boolean logic gates).

At 230, the separated portions of combinational logic are refined further into smaller clusters in accordance with a trade-off between cluster size and the inter-cluster cut size. In some embodiments, clustering is performed by starting with the existing partitioning, and segregating out combinational logic that is reachable from a partition boundary into its own cluster. Accordingly, in a clustering process according to some embodiments two clusters are initially created for each partition—one cluster of boundary-reachable combinational logic and one cluster that contains the rest of the logic (sequential logical and fully-contained combinational cones). Starting with these initial clusters, the boundary-reachable combinational clusters are refined into smaller sub-clusters while carving out the hybrid clusters, where the refinement is made in accordance with the above noted trade-off between cluster size and inter-cluster cut size.

In more detail, in some embodiments of the present disclosure, the granularity of replication is cluster-based. Therefore, clusters that are too large may result in unnecessary replication of non-critical intra-cluster side-paths that belong to the fanin cones of critical outputs of those clusters, leading to large replication overheads (in both cutsizes and look-up tables or LUTs). On the other hand, if the clusters are too small, the number of clusters will be very large, potentially resulting in a large compile time overhead in performing the relocation computation.

Accordingly, some aspects of embodiments relate to refining the clusters while reducing or minimizing the cutsizes between the clusters, because these cutsizes will, upon replication, add to the cutsizes between partitions. Large cutsizes between partitions correspond to large numbers of crossings between different FPGAs (and their resulting large socket delays in accordance with multiplexing ratios due to the limited inputs and outputs of the FPGAs), as well as potential difficulties with FPGA compilation. Also, in some embodiments, refining the combinational clusters includes attempting to encapsulate all elements of a given combinational loop within a same cluster, with a tradeoff of avoiding the creation of very large clusters, because both the timing and the optimization of such loops is typically problematic, especially if they end up crossing partitions due to replication.

At 240, the computer system constructs a timing graph based on these clusters, with timing nodes corresponding to the pins of these clusters and with timing arcs corresponding to the transitive connectivity between these pins. A timing arc refers to a signal path between two pins in an integrated circuit, where a change in a signal value at one pin may cause a change in the signal value at the other pin, and where there may be some timing delay through the portions of the circuit between those pins (e.g., delays introduced by wires and combinational logic gates). A timing graph represents one or more timing arcs representing the connections between the pins that are included in the timing graph. Some timing arcs will correspond to intra-cluster logic (within a cluster, e.g., the delay between inserting a signal at an input pin of a cluster and observing a corresponding change at an output pin of the cluster), whereas other timing arcs will correspond to inter-cluster interconnects (between an output pin of a cluster and an input pin of another cluster). At 250, the computer system performs a timing analysis based on this timing graph, estimating the delay of partition crossings (e.g., crossings between different partitions p) using heuristic delay models or probabilistic routing (e.g., congestion-aware) based delay estimates. In some embodiments, probabilistic routing refers to the assumption that all direct and 1-extra-hop routes for a given inter-partition net are equally likely, thus generating probabilities for it to cross between various partitions. Accordingly, the expected cutsizes between each pair of partitions can be computed by summing these probabilities over all nets. These cutsizes can then be translated to expected (average) multiplexing ratios (XDRs) between partitions, which in turn can be translated into estimated socket delays based on the estimated XDRs for those sockets. At 260, for each timing-critical endpoint, the computer system localizes the timing-critical clusters in its transitive fanin, and, at 270, the computer system translates the localized cluster level solution back into the netlist.

In some examples, the delays of all the paths in the timing graph are normalized by their respective multi-cycle-path values, obtained from clock edge analysis. The timing analysis results include the identification of the critical and near-critical paths, which are candidates for localization (e.g., relocation and/or replication into fewer partitions or a single partition), thus decreasing the localization overhead significantly (e.g., the cost of replicating the logic, i.e. the increase in LUT count and/or inter-partition cutsizes, where the goal of localization is to reduce the inter-partition component of the delay associated with the critical paths). Clustering the combinational logic at 230 improves the scalability of this approach, because the timing analysis and dynamic programming algorithm runs on the cluster graph, which, in some embodiments, is two to three orders of magnitude smaller than the corresponding graph of primitive elements (e.g., individual logic gates) of original netlist. For example, in some embodiments, each cluster contains on the order of a few hundred to a few thousand primitive elements (e.g., combinational logic gates).

In general, each cluster of combinational logic elements will contain multiple output pins. However, because the dynamic programming algorithm operates upon the individual output pins of the cluster (rather than the cluster as a whole), the granularity of the localization decisions is the transitive fanin cone for a cluster output pin that lies within that cluster (as opposed to localizing the entire cluster). In other words, localizing an output pin of a cluster to one or more partitions results in localizing or instantiating only the circuit elements of the transitive fanin cones to the output pin lying within that cluster (partial replication of a cluster).

Only the overheads of placing the nodes within the transitive fanin cone of the selected output pin will be considered, without considering the overheads associated with other nodes that may be in the same cluster, but not part of the transitive fanin cone of the selected output pin. This approach can reduce the emulation overhead when localizing clusters because, for example, when a particular output pin (e.g., an output pin A) is to be replicated in multiple partitions, among all of the primitive elements of a cluster, only the transitive fanin cone associated with the output pin of interest (output pin A) needs to be replicated-assuming other output pins of the cluster (e.g., an output pin B) are not replicated in the same partition as output pin A, the other elements of the cluster that are part of the transitive fanin cone of that other output pin (output pin B) but not a part of the transitive fanin cone of the replicated output pin (output pin A) need not be replicated. As one example, a cluster may have approximately 5,000 primitive elements and may have multiple output pins, but the transitive fanin cone for any given output pin may be approximately 500 primitive elements. Accordingly, taking a partial replication approach based on replicating only the transitive fanin cone or transitive fanin cones of the replicated output pins of interest (instead of the entire cluster) can significantly reduce the emulation overhead (e.g., number of LUTs consumed) by replicating the output pin in a given partition.

While the approach described above works well for simple data paths, it fails to find optimal solutions for many critical paths in the clock cone due to the bypass instrumentation that is frequently added to synchronous primitives (e.g., flip-flops and latches) in the clock cone. More precisely, the approach described above optimally solves each endpoint independently. Therefore, if a physical node is both a timing endpoint and a timing through-point, it cannot be handled optimally in the above formulation. These nodes that act as both a timing endpoint and a timing through-point are referred to herein as hybrid nodes or hybrid pins.

Figure 3:
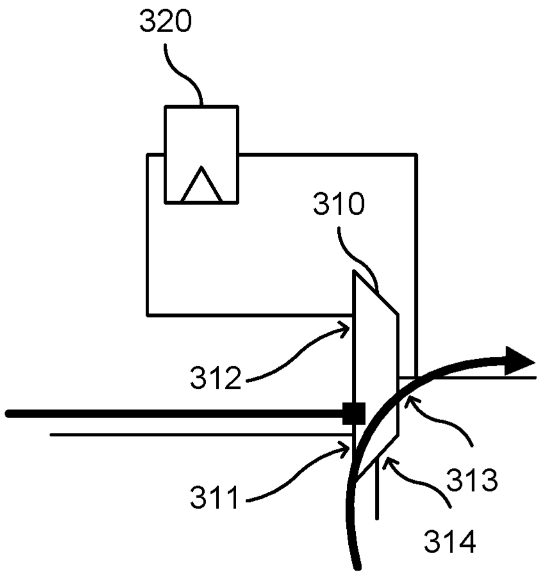
FIG. 3 depicts a bypass multiplexer (mux) that includes physical pins that are both timing endpoints and timing through-points and therefore these pins may be referred to as hybrid pins.

FIG. 3 depicts a bypass multiplexer (mux) 310 that includes physical pins that are both timing endpoints and timing through-points. In more detail, the multiplexer 310 has a first input pin 311 that takes a signal from a fanin node and a second input pin 312 that is connected to the output of sampling register 320, where the input of the sampling register 320 is connected to the output 313 of the mux 310. The bypass mux 310 represents the transformation of a latch circuit or a flip-flip circuit, typically one inside the clock cone. The sampling register 320 is used to retain the value stored in the latch or flip-flop during the driver clock cycles when that latch or flip-flop circuit is not being evaluated. The original clock of the latch or flip-flop is connected to a selector pin 314 of the mux 310 (directly connected in the case where the original circuit was a latch or through an edge detector in the case where the original circuit was a flip-flop).

If the original sequential circuit being transformed is an antipodal latch or if it is a flip-flop whose data input is provably an enable (stable in the driverClk cycle when a change in the clock signal is propagating out from the output 313 of the mux), then the timing path coming in via the pin 311 terminates at the output pin 313. The through-path here is the path coming in via the selector pin 314 and exiting through the output pin 313. As such, the output pin 313 is considered to be a hybrid pin.

If not handled correctly, these hybrid pins may result in additional delay in the localized netlist due to an extra inter-partition crossing (in cases where the timing endpoint behavior dominates during timing optimization) or excessive overhead due to over-optimization (e.g., excessive replication of circuit elements in multiple partitions, such as in a chain of antipodal latches, if the timing through-point behavior dominates during timing optimization). Such physical nodes including hybrid pins are common in the emulation instrumentation added to clock cones, especially with fetch mode clock processing. For instance, they arise from bypass muxes (e.g., as shown in FIG. 3) added to antipodal clock cone latches, or from bypass muxes for clock cone registers driven by clock enables. One approach to removing performance bottlenecks in the clock cone is to maximize the number of signals that can be proven to be clock enables.

Therefore, some aspects of the present disclosure relate to performing correct clock cone localization, even in the presence of such hybrid pins. Some aspects of embodiments of the present disclosure relate to modeling a physical node that is simultaneously a timing endpoint and a timing through-point as a hybrid cluster and evaluating its delay cost separately for a local version (e.g., endpoint version) and a propagating version (e.g., a through-point version, using the definition of the delay cost presented in Equation (1) above).

Figure 4A:
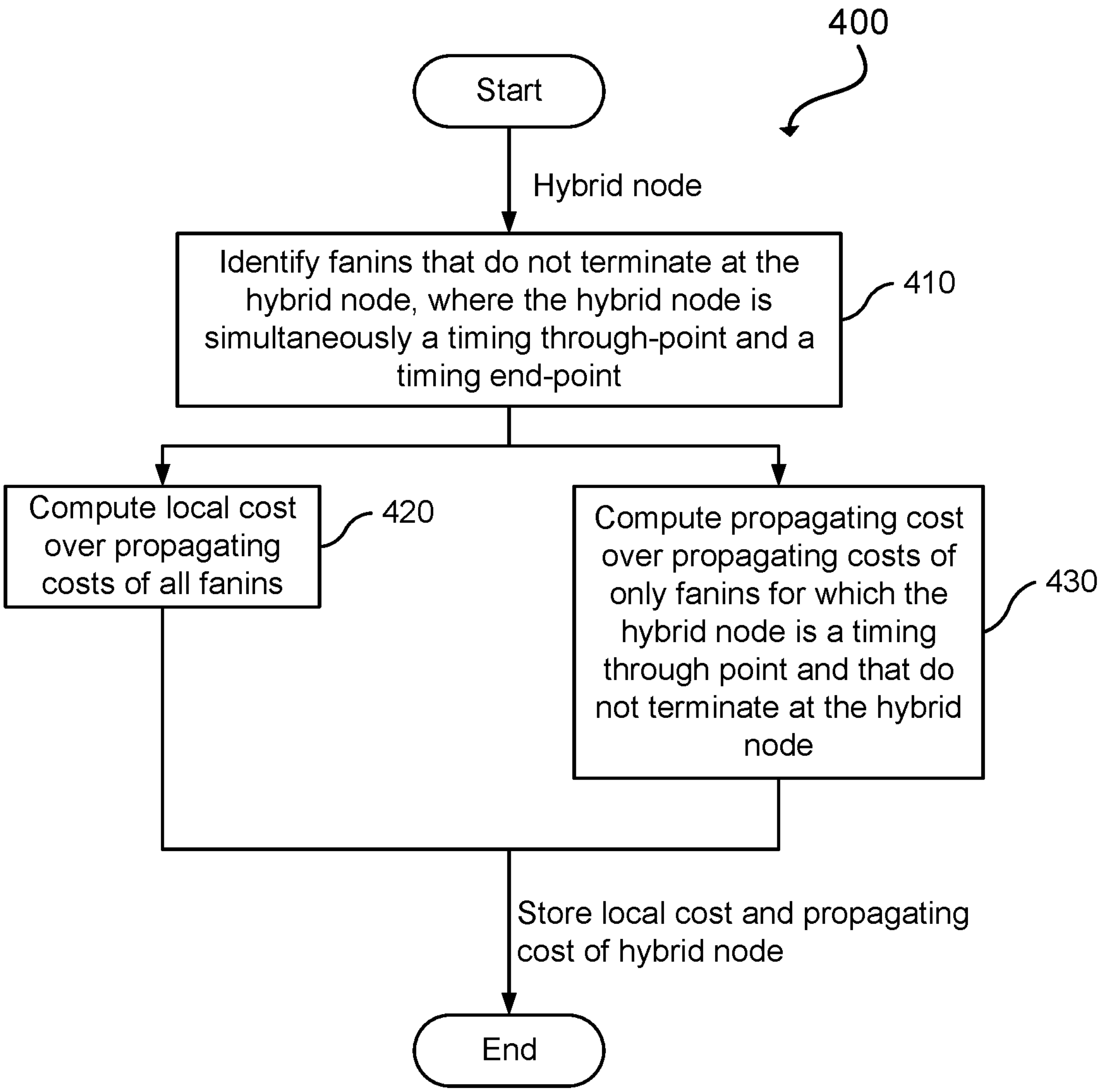
FIG. 4A is a flowchart of a method for computing the placement cost of a hybrid node or hybrid cluster that acts as both a timing through-point and a timing endpoint.
Figure 4B:
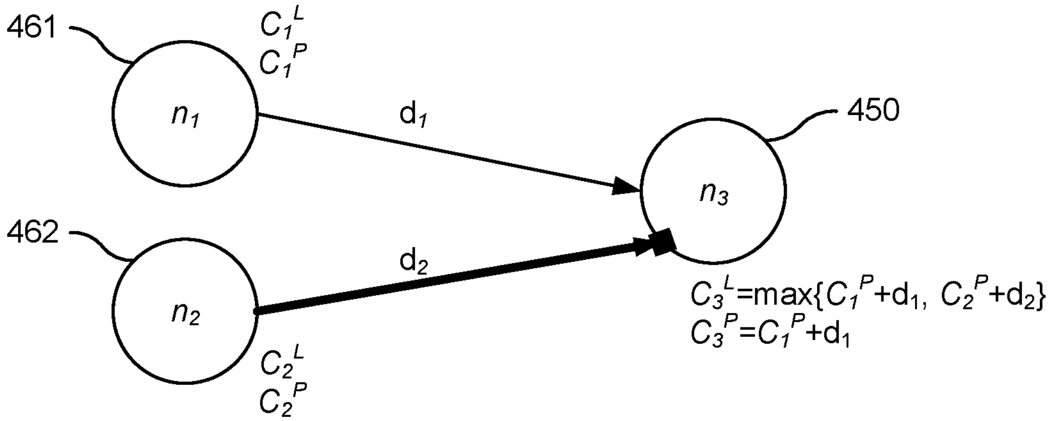
FIG. 4B depicts an example of calculating local costs and propagating costs of a hybrid node or hybrid cluster, for a given optimal (e.g., minimum cost) choice of placements for fanin nodes, according to one example of the present disclosure.

FIG. 4A is a flowchart of a method 400 for computing the placement cost of a hybrid node or hybrid cluster that acts as both a timing through-point and a timing endpoint. FIG. 4B depicts an example of calculating local costs and propagating costs of a hybrid node or hybrid cluster $n_3$ 450, given the optimal costs for a given choice of placements for fanin nodes, according to one example of the present disclosure. In this context, a cost is a representation of a magnitude of a delay in the circuit. As noted above, aspects of embodiments of the present disclosure relate to relocating nodes or clusters representing different parts of an integrated circuit design into partitions to reduce partition crossing delays (which arise from single pieces of emulation hardware being too small to hold the full integrated circuit design), thereby improving the speed at which the emulation system can emulate the integrated circuit. The local cost represents the cost of placing the current node of the integrated circuit design in a given partition, which is calculated based on the costs (e.g., the delays) associated with other nodes whose signals feed into the current node. The propagating cost represents the cost that the current node passes along to the nodes that receive the signals from the current node, such that those other nodes can compute their own costs based on the propagated cost from the current node.

At 410, the computer system identifies fanins (fanin signals) to the hybrid node that do not terminate at the hybrid node 450 (e.g., where the signal passing through the corresponding fanin node propagates through the hybrid node 450, which acts as a timing through-point for the signal). In this example, it is assumed that the signal passing through a first fanin node $n_1$ 461 does not terminate at the hybrid node 450 (where hybrid node 450 is a timing through-point for the signal passing through first fanin node $n_1$ 461), and the signal passing through a second fanin node $n_2$ 462 does terminate at the hybrid node 450 (where hybrid node 450 is a timing endpoint for the signal passing through second fanin node $n_2$ 462), as indicated by the heavy line with a square at its end.

At 420, the computer system computes the local cost $C_3^L$ associated with the current hybrid node $n_3$ by computing a maximum over the costs associated with all of its fanins (e.g., the costs associated with first fanin node $n_1$ 461 and second fanin node $n_2$ 462). When computing the local ($C^L$) and propagating costs ($C^P$) of the current node, only the propagating costs ($C^P$) of the fanin nodes are used. Thus, the local cost $C^L$ is used to determine the optimal fanin solution for the current node and its propagating cost $C^P$ is used while computing the optimal fanin solutions for all its downstream nodes. Accordingly, as shown in FIG. 4B, the local cost $C_3^L$ associated with the current hybrid node $n_3$ is computed by taking the maximum over the costs associated with the first fanin node $n_1$ and the second fanin node $n_2$. These costs are the sum of the propagating costs ($C_1^P$ and $C_2^P$, respectively) of those nodes plus the additional crossing delays ($d_1$ and $d_2$, respectively) associated with the placement of the fanin nodes and the current node in various partitions (e.g., placement in the same partition or different partitions). As such, the local cost $C_3^L$ of current node $n_3$ 450 can be calculated according to max $\{C_1^P+d_1, C_2^P+d_2\}$.

At 430 the computer system determines the propagating cost $C_3^P$ by computing a maximum over the costs of those fanins whose corresponding timing paths do not terminate at this current physical node (e.g., by excluding all of the costs associated with fanins where the current physical node serves as a timing endpoint). In the example of FIG. 4B, only the first fanin node $n_1$ 461 does not terminate at the current node $n_3$ 450. As such, the propagating cost $C_3^P$ of the current node $n_3$ is the propagating cost of the first fanin node $n_1$ 461 added to the crossing delay $d_1$ associated with the first fanin node $n_1$ 461. If there were multiple fanin nodes to the current node $n_3$ 450 whose corresponding timing paths did not terminate at the current node $n_3$, then the propagating cost $C_3^P$ of the current node $n_3$ would be calculated based on the maximum of those costs.

Computing costs for placements of the nodes or clusters into various partitions (placement costs) in accordance with the costs of placing fanin nodes or clusters into partitions generates a set of possible solutions for each node or cluster in the graph, where each solution corresponds to a possible placement of the node or cluster into one of the partitions or, in the case where the optimal solution is the replication of nodes, placement into multiple partitions.

Computing an optimal solution (placements of the nodes in the partitions) for the entire DAG representation of the integrated circuit design is computed by backtracing (or performing backward propagation), starting from the timing endpoints (e.g., the deepest levels or leaves of the DAG). In more detail, starting from a given timing endpoint, a solution is selected among the computed solutions having the minimum cost (e.g., minimum delay). This selected solution constrains the set of solutions (possible placements) for its direct fanin nodes (or clusters), and thus the process proceeds in reverse topological order by selecting a minimum cost placement of the direct fanin nodes (or clusters) from among the remaining valid solutions (consistent with the placement of the fanout node or fanout cluster). The process continues by selecting placements of each node (or cluster) until the input or starting nodes (or clusters) are reached and all of the nodes (or clusters) have been placed into partitions.

In embodiments of the present disclosure, solutions are constructed starting only from the non-hybrid timing endpoints. Hybrid endpoints can be ignored in this phase because the signal generated by these fanins is already accounted for by the propagating path of the corresponding hybrid cluster. The placements selected for a hybrid cluster are determined by the critical endpoints in its transitive fanout cone, based on propagating costs $C^P$. However, the retained optimal placement of a hybrid cluster in any given partition already includes the cost from all its fanins, because this placement was determined using its local cost $C^L$. Therefore, technique described herein computes the optimal placement of a hybrid cluster with respect to the true endpoints in its transitive fanout. Hybrid nodes or hybrid clusters are treated as movable and replicable, even though they typically include a sampling register that might otherwise cause the hybrid nodes or hybrid clusters to be identified as endpoints. In some embodiments, other clusters that include sampling registers added as instrumentation (such as non-hybrid bypass muxes, edge detectors etc.), can also be treated as movable and replicable between partitions.

Paths driven by a hybrid cluster that feed back into its terminating input also appear as loops in the dynamic programming approach discussed above. Therefore, some aspects of embodiments of the present disclosure relate to topologically sorting the nodes by breaking the loops involving a hybrid cluster within the hybrid cluster and not at an inter-cluster edge, because breaking the loop at an inter-cluster edge can result in an unaccounted-for partition crossing when computing the costs of placing the hybrid clusters or placement costs of the hybrid clusters (e.g., where each placement cost represents the delays resulting from placing the hybrid clusters in a corresponding one of the partitions).

Some aspects of embodiments of the present disclosure relate to breaking a loop that includes a hybrid cluster H that is involved in a loop through what would otherwise be identified as a terminating edge e.

Figure 5A:
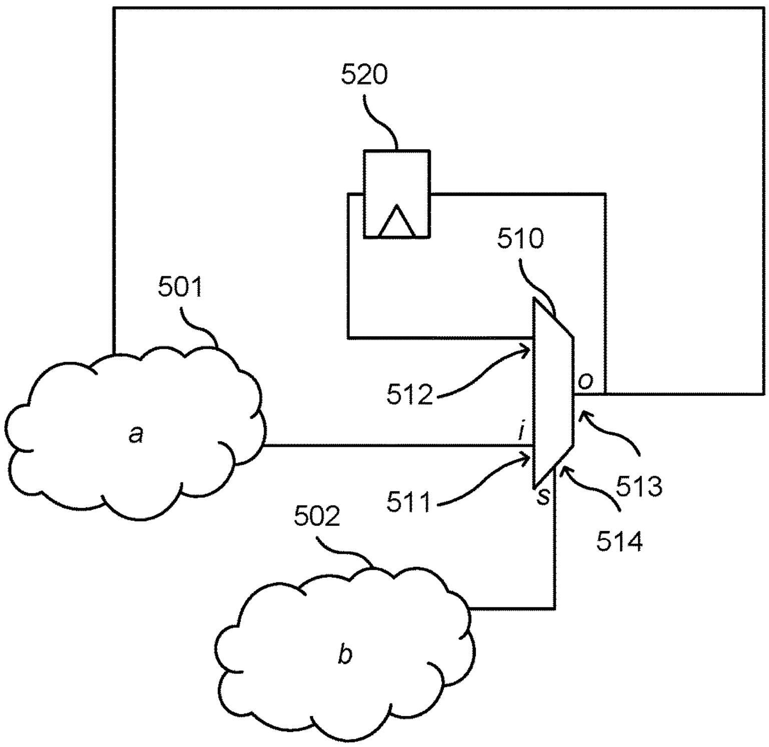
FIG. 5A depicts a loop that includes a hybrid cluster containing a bypass multiplexer (mux).

FIG. 5A depicts a loop that includes a hybrid cluster containing a bypass multiplexer (mux) 510. In more detail, the multiplexer 510 has a first input pin i 511 that takes a signal from a first fanin cone a 501 and a second input pin 512 that is connected to the output of a sampling register 520, where the input of the sampling register 520 is connected to the output pin o 513 of the mux 510. A selector pin s 514 of the multiplexer 510 is connected to the output of a second fanin cone b 502. The behavior of the bypass mux 510 tracks that of the bypass mux 310 described above with respect to FIG. 3.

Figure 5B:
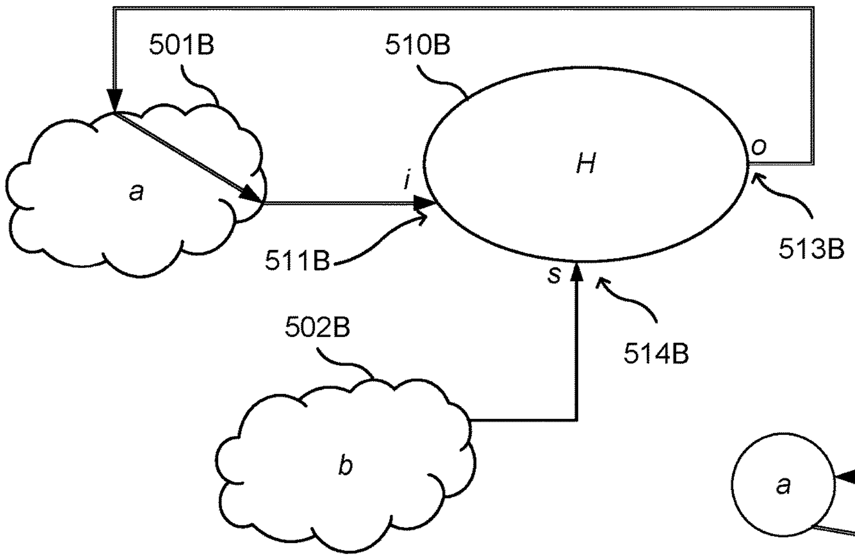
FIGS. 5B and 5C depict the breaking of a loop that includes a hybrid cluster according to one embodiment of the present disclosure.
Figure 5C:
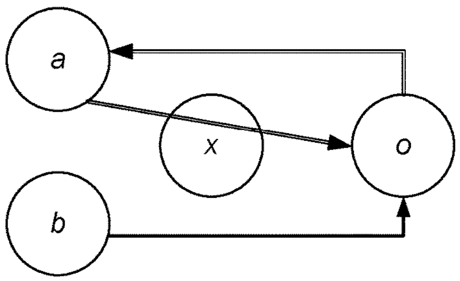

FIGS. 5B and 5C depict the breaking of a loop that includes a hybrid cluster according to one embodiment of the present disclosure. FIG. 5B shows a timer graph where the separate primitive circuit elements, including the mux 510 and the sampling register 520 are grouped together into a hybrid cluster H 510B, having a corresponding input pin i 511B, output pin o 513B, and selector pin s 514B. The loop that connects the output pin o 513B to the input pin i 511B includes a first net from the output pin o 513B to the first fanin cone a 501B, an arc through the first fanin cone a 501B, and a net from the first fanin cone a 501B to the input pin i 511B. The directed edges of the graph corresponding to the loop are shown with doubled lines (the edge from the second fanin cone b 502B into the selector pin s 514B is not part of the loop).

FIG. 5C shows a graph generated when computing the placements of the nodes and clusters and when breaking the loop in the timing graph. In more detail, the computer system generates a new movable virtual endpoint x for the hybrid cluster at an edge e that breaks the loop (e.g., between the input pin i and the output pin o of the mux shown in FIG. 5A). Then optimal solutions are generated for this virtual endpoint x for each partition (by computing the placement costs of placing the virtual endpoint x in each partition, as described above). Finally, the virtual endpoint x is forced to be placed in the same partition or partitions as the output (e.g., output pin o 513B) of its corresponding hybrid cluster H 510B.

During the backtracing stage, the backward propagation from non-hybrid endpoints is performed as usual, thus determining the locations of the hybrid cluster H (placements into partitions) based on optimal solutions for its non-virtual transitive fanout endpoints. Then, for each partition containing the hybrid cluster H, the optimal solution for virtual endpoint x in that partition is also selected (note that this solution has already been generated during the forward propagation, because x was considered as a node that is movable between partitions). This approach generates a performance-optimal solution, although a small area overhead may be incurred because the fanin cone for x is not seen when optimizing the sharing between solutions for non-hybrid endpoints during the backward propagation. Accordingly, embodiments of the present disclosure place hybrid clusters H that participate in loops into performance-optimal partitions for emulation.

Some aspects of the present disclosure relate to efficiently identifying the terminating edges within the loops. Although performing a depth-first search can detect and break all loops within a single traversal by deleting back-edges, such a depth-first search does not guarantee that the loops will be broken only at terminating edges (e.g., the edges that connect to an endpoint, as opposed to connecting to a through-point). Therefore, some aspects of embodiments of the present disclosure relate to breaking loops at terminating edges in an iterative manner.

Figure 6:
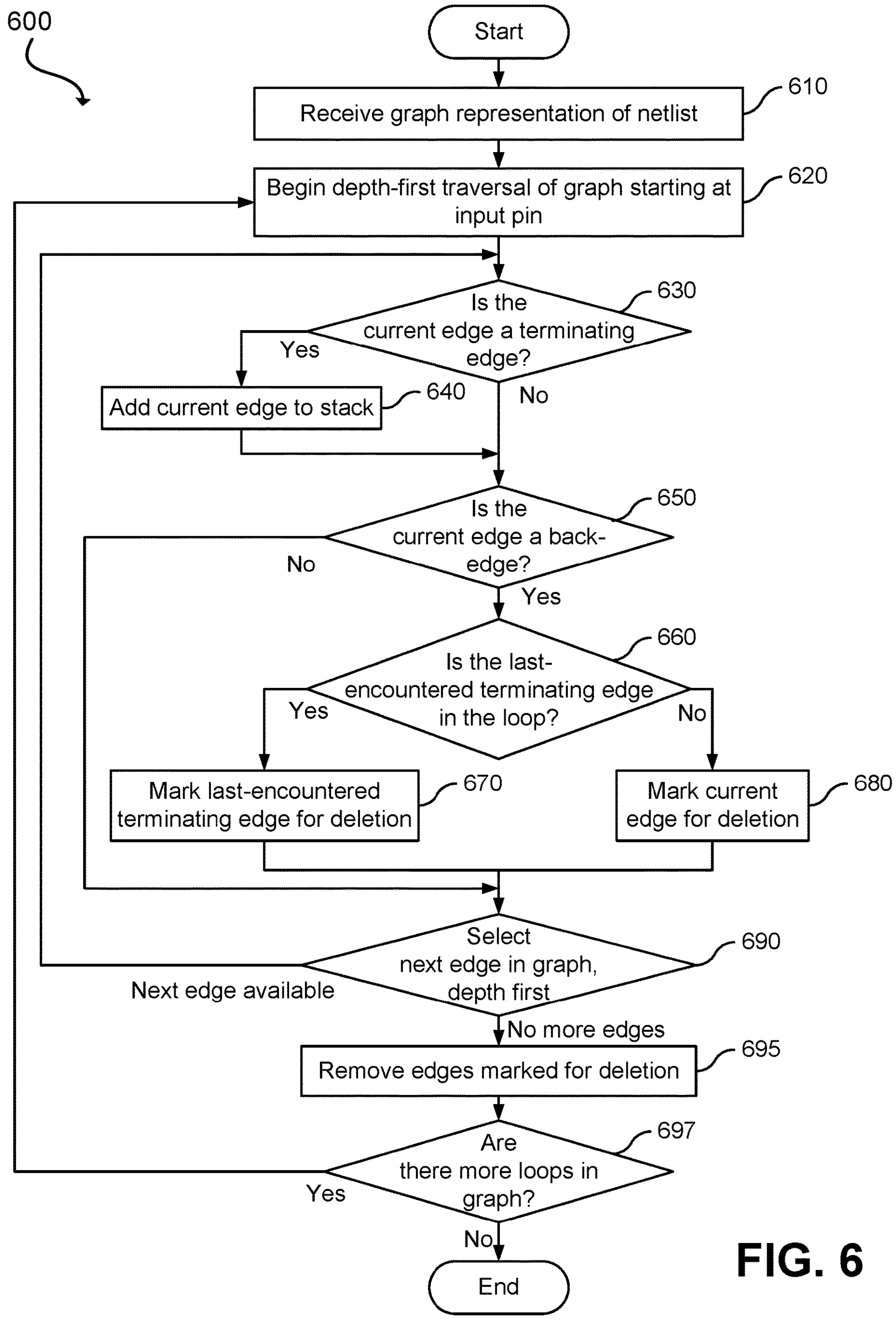
FIG. 6 is a flowchart of a method for breaking a loop at a terminating edge according to one embodiment of the present disclosure.

FIG. 6 is a flowchart of a method 600 for breaking a loop at a terminating edge according to one embodiment of the present disclosure. At 610, the computer system receives a directed graph representation of the clustered netlist. At 620, the computer system begins a depth-first traversal of the graph starting at an input pin of the graph. At 630, the computer system determines whether a current edge encountered during the traversal is a terminating edge. In a case where the current edge is a terminating edge, then at 640 the computer system stores the current edge in a data structure (e.g., a stack data structure) before proceeding to 650. In a case where the current edge is not a terminating edge, then the computer system proceeds to 650.

At 650, the computer system determines whether the current edge is a back-edge. In a case where the current edge is not a back-edge, then the computer system proceeds with selecting a next edge in the graph at 690. In the case where the current edge is a back-edge, then at 660 the computer system determines whether the last-encountered terminating edge is in the current loop associated with the back-edge. In a case where the last-encountered terminating edge is in the loop, then at 670 the computer system marks for deletion (or virtually deletes) that last encountered terminating edge, thereby enabling the subsequent breaking of the current loop. On the other hand, in a case where the last-encountered terminating edge is not inside the current loop, then the loop is broken by marking the back edge for deletion at 680. At 690, the computer system selects a next edge in the graph, on a depth-first basis. If there is a next edge available, then the selected next edge is set as the current edge and the loop continues at 630. After all the edges in the graph have been thus processed (e.g., if there are no more edges to process), the computer system proceeds with removing the virtually deleted edges (the edges marked for deletion) at 695, and, at 697, determines if there are more loops in the graph. If so, then the computer system continues with the next loop at 620. The process is repeated until no further loops are present (e.g., following the no branch from 697). In general, the number of iterations required to make the graph loop-free in this manner is very small (<5) even on very large and complex designs.

Some aspects of embodiments of the present disclosure further relate to pruning non-critical fanins in the transitive fanin cones of critical endpoints. Under some circumstances, the entire fanin cone of selected critical and near-critical endpoints is replicated in multiple partitions, which may result in the replication of non-timing-critical elements from those fanin cones. As described above, partial replication of a cluster according to some embodiments reduces the replication overhead by replicating only the elements that are within the transitive fanin cones of the replicated output node and refraining from replicating elements of the cluster that are outside of the relevant fanin cone or relevant fanin cones. Pruning away non-critical fanins from the transitive fanin cone further reduces the replication overhead associated with inter-cluster paths.

In more detail, some embodiments of the present disclosure relate to a pruning process that accounts for multi-cycle paths (MCPs) in the integrated circuit design when identifying non-critical fanin nodes that can be pruned (e.g., omitted from the replication process). In more detail, a multi-cycle path (MCP) is a combinational path in a circuit, where the time available for a signal to propagate through the MCP is longer than a single clock cycle, and therefore takes multiple clock cycles. The input supplied to an MCP is therefore held constant by certain registers over some specified number of clock cycles (typically denoted as m clock cycles), where the clock cycle may be specified as a number of clock cycles of a driver clock or system clock of the emulation system. (An emulation system is typically controlled by a system clock or reference clock, referred to as the driver clock, which is set to a frequency that is typically twice as fast that of the highest frequency user clock, e.g., clock that is part of the integrated circuit design being emulated.) Therefore, an m-MCP path is a path in which the output of the logic cone, once stabilized, cannot change in less than m cycles (e.g., remains constant for at least m cycles).

In some embodiments, for any given output o of a cluster, the fanin cone at input i of that cluster is pruned away if a cumulative multi-cycle path (MCP)-normalized delay to output o along input i is smaller than a threshold fraction of the maximum cumulative MCP-normalized delay to output o, and the tightest MCP value along input i is greater than a threshold MCP value (a sensitivity condition). The sensitivity condition is to prevent the pruned path from becoming critical if it ends up with an extra partition crossing owing to it not being localized. The pruning decision of an edge is specific to each of its fanouts, and therefore an edge may be pruned for some of its fanout clusters, but not for others, depending on their relative delays and criticalities.

Figure 7:
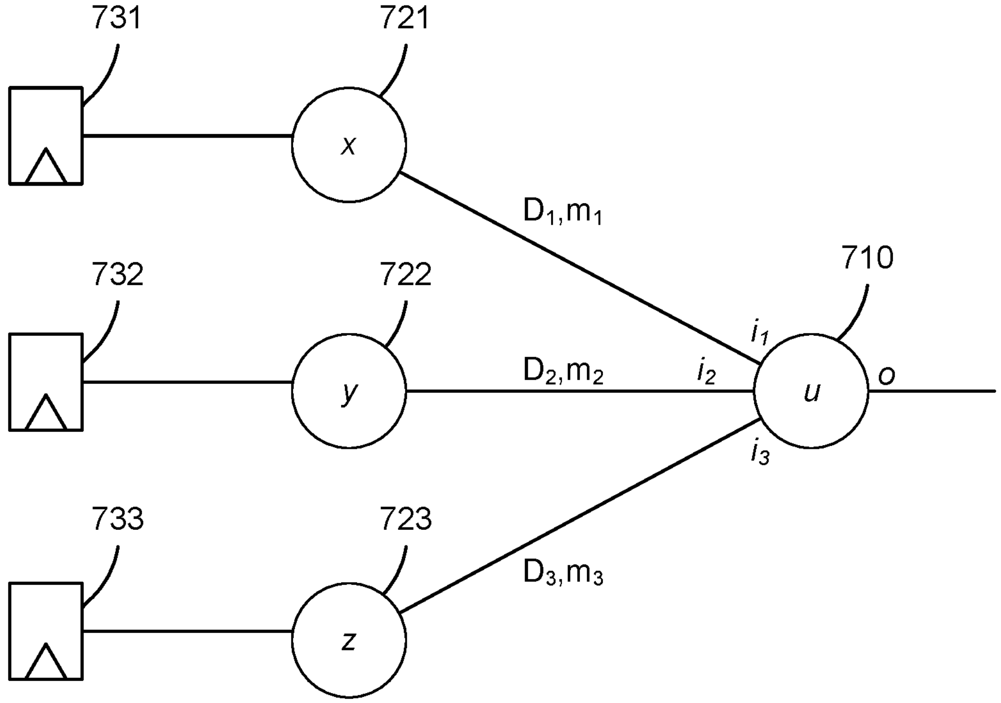
FIG. 7 is a schematic depiction of a portion of a timing graph of a cluster, where a node u 710 has three inputs, including first input $i_1$ from a first node x 721, second input $i_2$ from a second node y 722, and third input is from a third node z 723, each of which forms a different MCP.

FIG. 7 is a schematic depiction of a portion of a timing graph of a cluster, where a node u 710 has three inputs, including first input $i_1$ from a first node x 721, second input $i_2$ from a second node y 722, and third input is from a third node z 723, each of which forms a different tightest MCP. The first node x 721 is connected to a first register 731, the second node y 722 is connected to a second register 732, and the third node z 723 is connected to a third register 733. The largest delay along an i-th input may be referred to as $D_i$, and the tightest MCP time (in cycles) during which the register holds the value constant along the i-th path is referred to as $m_i$, such that the MCP-normalized delay to output o along an i-th input is bounded above by $D_i/m_i$.

As noted above, in one embodiment, an i-th fanin can be pruned if the following conditions are met:

$$\frac{D_i}{m_i} < k * \max_j\left(\frac{D_j}{m_j}\right) \text{ and}$$

$$M_i > l$$

where k is a threshold fraction and/is an MCP constraint (e.g., the threshold fraction may be set to ⅓ and the MCP constraint l may be set to 2, but embodiments of the present disclosure are not limited thereto), and where the maximum MCP normalized delay is computed over all fanins to the node u.

More concretely, the first condition checks that, the i-th fanin can be pruned as long as its MCP normalized delay ($D_i/m_i$) is relatively small compared to the MCP normalized delay of the other inputs to the node (e.g., less than a threshold fraction of the maximum MCP normalized delay among all of the inputs). This condition relates to checking whether the i-th fanin is a fast-arriving signal (a short MCP-normalized delay) and therefore there may be sufficient slack to delay the i-th fanin due to another signal having a long MCP-normalized delay. If so, then it may be acceptable to add the delay due to a partition crossing to the fast arriving i-th signal without affecting the overall delay through to the output o of the current node u 710. In other words, when current node u 710 is to be replicated in another different partition, a fanin node (e.g., first node x 721) corresponding to a fast-arriving signal does not necessarily need to be replicated in the other partition, even though it is part of the fanin cone to the current node u 710, because there's enough delay slack along this path to absorb the additional delay of the partition crossing.

The second condition, referred to as the sensitivity condition, checks that, even if an additional partition crossing was added to the signal (e.g., by not replicating the corresponding node in another partition), the additional partition crossing does not change the criticality (e.g., by making that newly delayed signal the critical signal that sets the overall delay through current node u 710) In the embodiment described above, this relates to checking that $M_j$ is greater than a threshold value. In some embodiments, the threshold value is two ($M_j$>2). For example, supposing that each partition crossing adds 1000 ns of delay, if a path with an MCP of one includes one partition crossing, then this path incurs a penalty of 1000 ns. If the tightest MCP across a given input edge is, say 16 cycles, then the MCP-normalized penalty is 62.5 ns (1000 ns/16) The larger the MCP, the lower the effective penalty due to the partition crossing delay. In some embodiments, we can use only the sensitivity condition to prune away non-critical fanin clusters.

Accordingly, aspects of embodiments of the present disclosure relate to methods for localizing hybrid pins, which are typically used in clock instrumentation during emulation of integrated circuit designs. These methods include the use of split costing between a local cost for computing an optimal location of a hybrid pin and a propagating cost for downstream nodes, where the propagating cost is computed based only on fanins that provide a propagating input, whereas the local cost is computed based on both propagating inputs and terminating inputs. Aspects of embodiments of the present disclosure also relate to breaking loops that involve hybrid pins.

Figure 8:
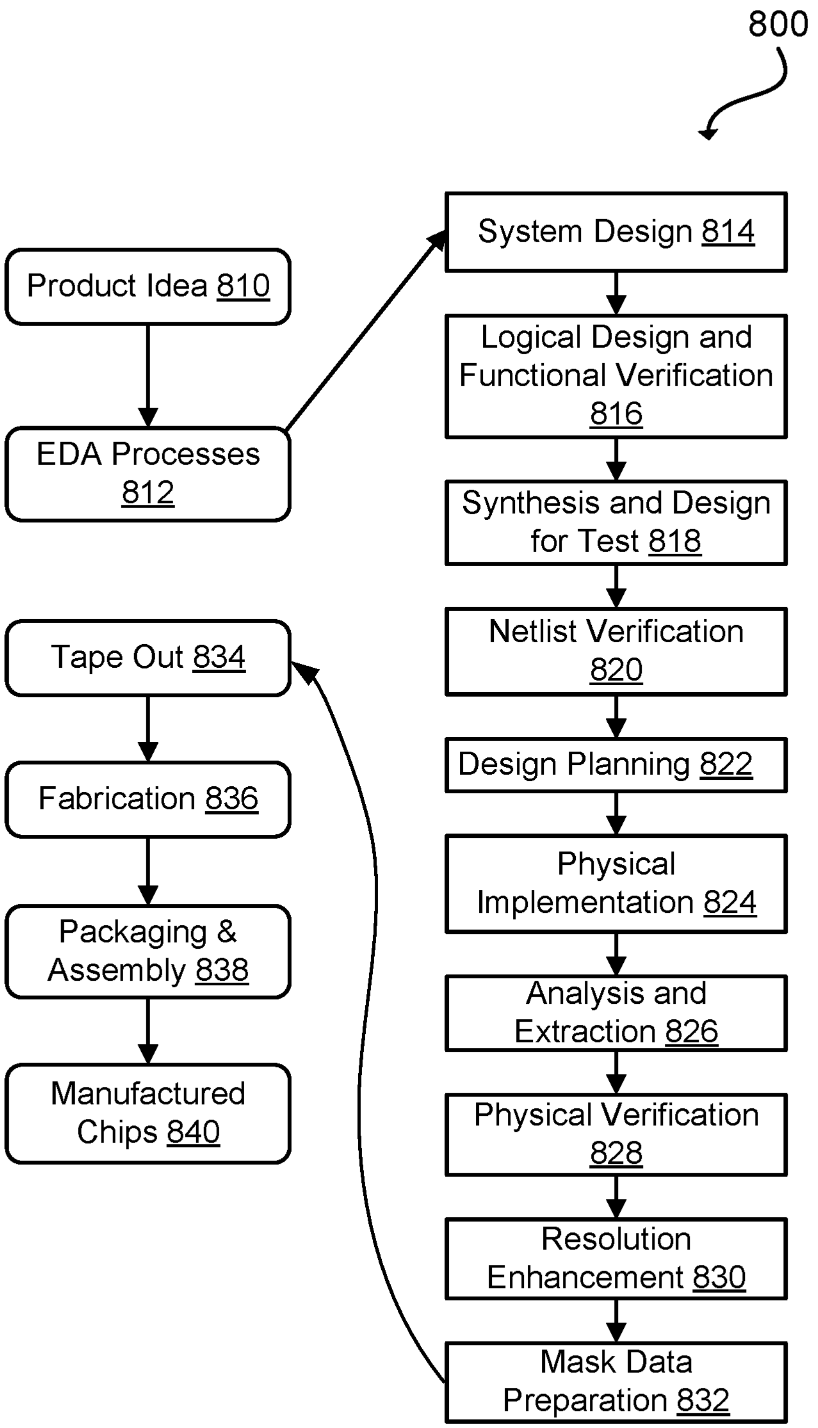
FIG. 8 depicts a flowchart of various processes used during the design and manufacture of an integrated circuit in accordance with some embodiments of the present disclosure.

FIG. 8 illustrates an example set of processes 800 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 1000 of FIG. 10, or host system 907 of FIG. 9) may be used to store the programs and data structures that are used by some or all of the EDA products described herein, and products used for development of cells for the library and for physical and logical design that use the library.

Figure 9:
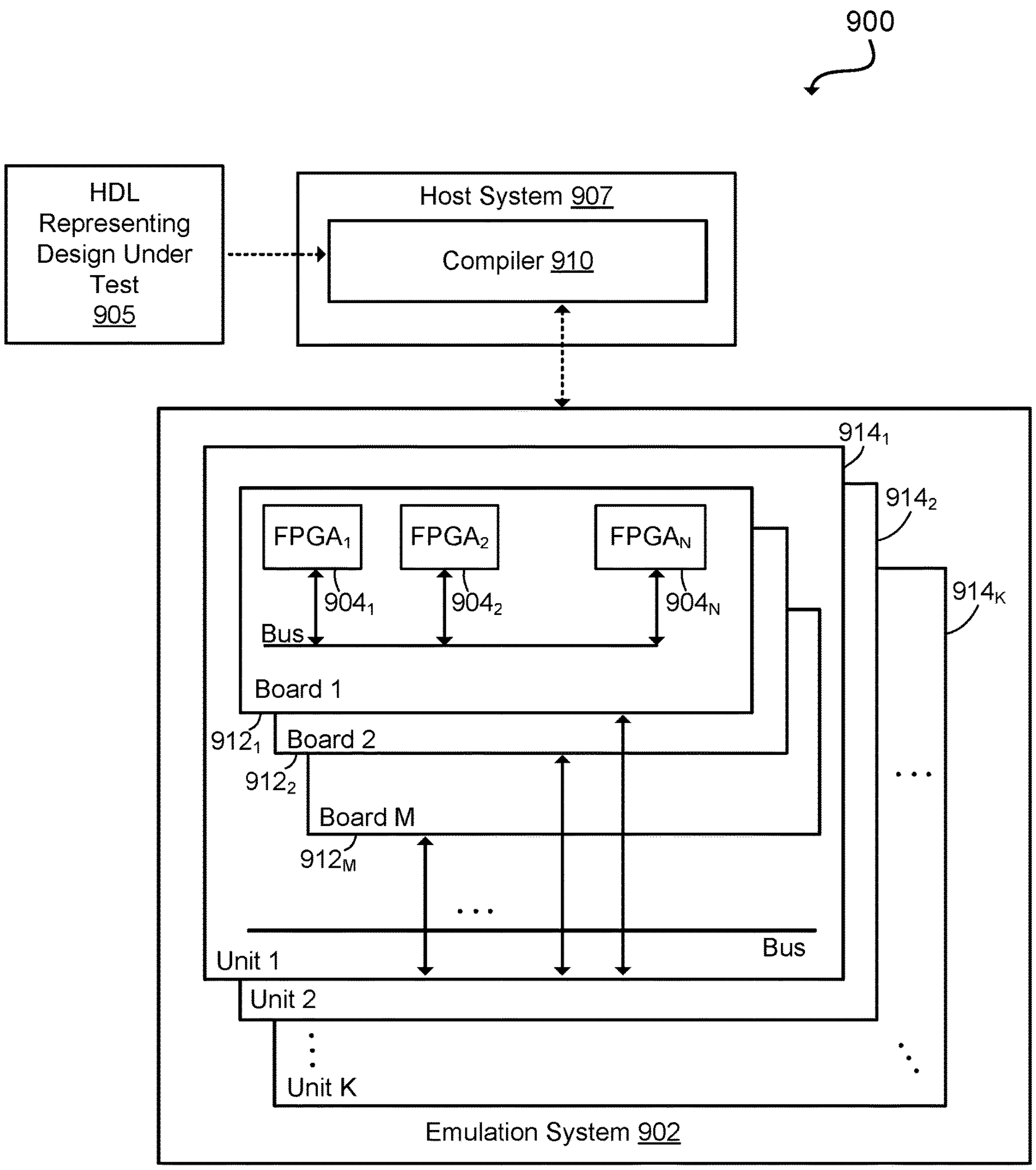
FIG. 9 depicts a diagram of an example emulation system in accordance with some embodiments of the present disclosure.

FIG. 9 depicts a diagram of an example emulation environment 900. An emulation environment 900 may be configured to verify the functionality of the circuit design. The emulation environment 900 may include a host system 907 (e.g., a computer that is part of an EDA system) and an emulation system 902 (e.g., a set of programmable devices such as Field Programmable Gate Arrays (FPGAs) or processors). The host system generates data and information by using a compiler 910 to structure the emulation system to emulate a circuit design. As noted above, in some embodiments of the present disclosure, the localization of blocks to particular partitions is implemented in the compiler 910 to localize portions of the circuit design in particular FPGAs of the emulation system to reduce latency costs associated with inter-FPGA communication delays, and inter-board communication delays, and inter-unit communication delays. A circuit design to be emulated is also referred to as a Design Under Test ('DUT') where data and information from the emulation are used to verify the functionality of the DUT.

The host system 907 may include one or more processors. In the embodiment where the host system includes multiple processors, the functions described herein as being performed by the host system can be distributed among the multiple processors. The host system 907 may include a compiler 910 to transform specifications written in a description language that represents a DUT and to produce data (e.g., binary data) and information that is used to structure the emulation system 902 to emulate the DUT. The compiler 910 can transform, change, restructure, add new functions to, and/or control the timing of the DUT.

The host system 907 and emulation system 902 exchange data and information using signals carried by an emulation connection. The connection can be, but is not limited to, one or more electrical cables such as cables with pin structures compatible with the Recommended Standard 232 (RS232), universal serial bus (USB), or Peripheral Component Interconnect Express (PCIe or PCI Express) protocols. The connection can be a wired communication medium or network such as a local area network or a wide area network such as the Internet. The connection can be a wireless communication medium or a network with one or more points of access using a wireless protocol such as BLUETOOTH or IEEE 802.11. The host system 907 and emulation system 902 can exchange data and information through a third device such as a network server.

The emulation system 902 includes multiple FPGAs (or other modules) such as FPGAs 9041 and 9042 as well as additional FPGAs to 904N. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 902 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $904_1$-$904_N$ may be placed onto one or more boards $912_1$ and $912_2$ as well as additional boards through $912_M$. Multiple boards can be placed into an emulation unit $914_1$. The boards within an emulation unit can be connected using the backplane of the emulation unit or any other types of connections. In addition, multiple emulation units (e.g., $914_1$ and $914_2$ through $914_K$) can be connected to each other by cables or any other means to form a multi-emulation unit system.

For a DUT that is to be emulated, the host system 907 transmits one or more bit files to the emulation system 902. The bit files may specify a description of the DUT and may further specify partitions of the DUT created by the host system 907 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 907 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 907 and/or the compiler 910 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 905 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 10:
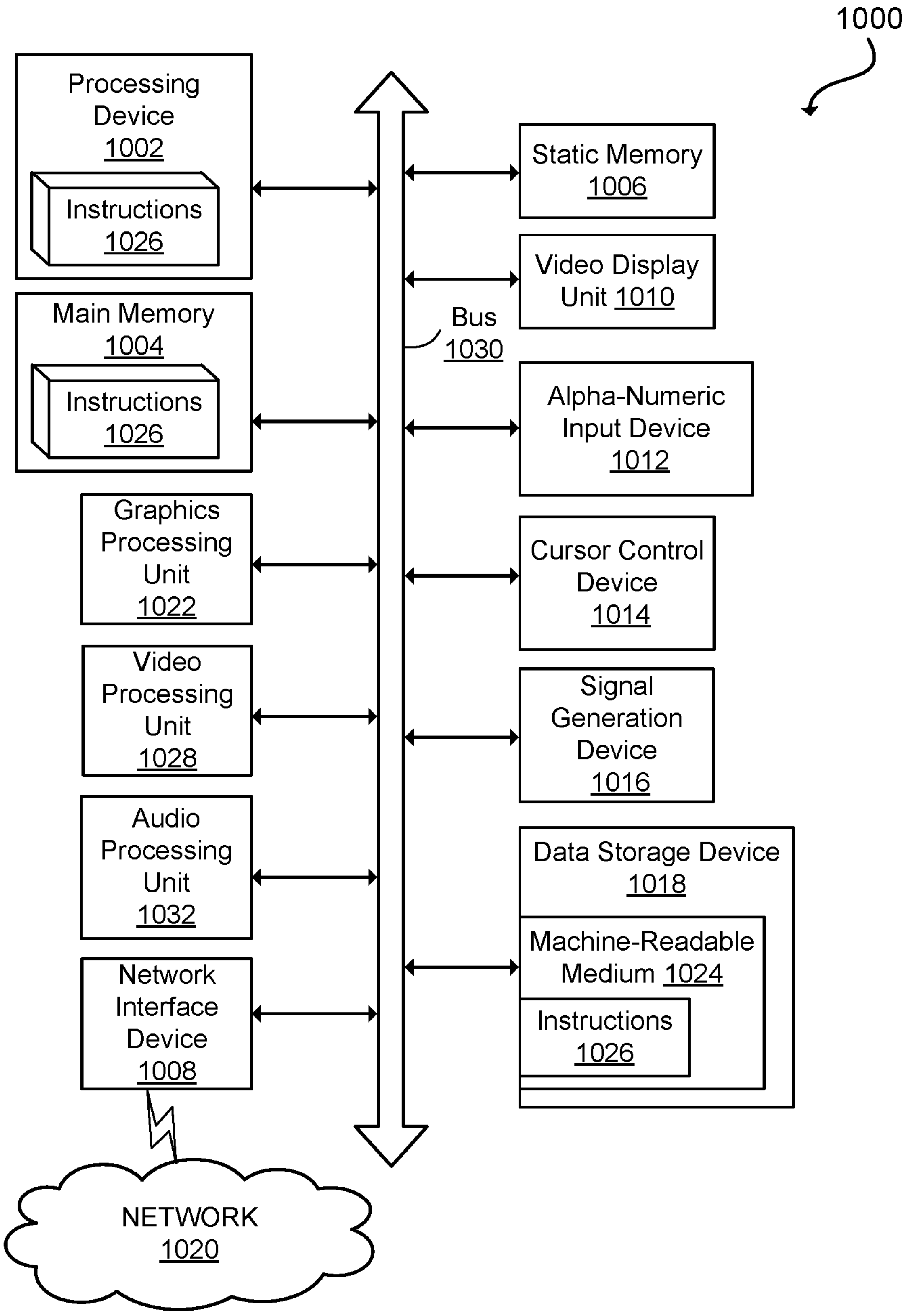
FIG. 10 depicts a diagram of an example computer system in which embodiments of the present disclosure may operate.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:

receiving a representation of a circuit design;

grouping combinational logic portions of the circuit design into clusters corresponding to circuit portions of the circuit design;

constructing a timing graph based on timing arcs through the clusters;

computing, for each cluster of the clusters comprising a hybrid pin that behaves as a timing endpoint and a timing through-point along different paths in the circuit design:

a propagating cost computed based on propagating costs of fanin clusters for which the hybrid pin acts as a timing through-point; and a local cost computed based on propagating costs of all of the fanin clusters;

determining, by a processing device, a partition from among a plurality of partitions of an emulation system to place a cluster of the circuit design based on reducing a placement cost associated with the cluster, the placement cost of each cluster comprising a hybrid pin being computed based on the local cost associated with the cluster; and placing a circuit portion corresponding to the cluster in the partition of the plurality of partitions of the emulation system to emulate a circuit in accordance with the circuit design.

2. The method of claim 1, wherein the determining the partition from among the plurality of partitions comprises computing a cost of placing the cluster in each of the plurality of partitions based on the costs of placing a plurality of fanin clusters to the cluster in the plurality of partitions, and wherein the cost is computed based on a plurality of costs of placing all of the fanin clusters to the cluster.

3. The method of claim 1, wherein the circuit portion comprises a hybrid pin that behaves as a timing endpoint and a timing through-point along different paths in the circuit design, and wherein the method further comprises:

detecting a topological loop through the hybrid pin in the circuit design;

creating a movable virtual endpoint at a terminating edge of the hybrid pin; and breaking the topological loop at the terminating edge.

4. The method of claim 3, wherein the determining the partition from among the plurality of partitions further comprises backtracing from a timing endpoint of the timing graph, and wherein the method further comprises:

generating solutions for the movable virtual endpoint corresponding to the plurality of partitions; and selecting one or more solutions for the virtual endpoint corresponding to one or more partitions in which the hybrid pin is placed during the backtracing.

5. The method of claim 1, wherein a cluster corresponding to the circuit portion comprises a plurality of output nodes, and wherein the determining the partition from among the plurality of partitions comprises, for an output node of the output nodes of the cluster:

determining logic elements of the cluster in a transitive fanin cone of the output node; and replicating the output node and the transitive fanin cone of the output node in the partition, without replicating logic elements of the cluster that are not in the transitive fanin cone of the output node in the partition.

6. The method of claim 1, wherein the cluster comprises a plurality of multi-cycle paths connected to an output of the cluster, and wherein the determining the partition of the plurality of partitions to place the cluster comprises pruning the cluster to be replicated in the partition of the plurality of partitions by:

computing a plurality of multi-cycle path-normalized delays corresponding to the multi-cycle paths;

determining one or more of:

that a multi-cycle path-normalized delay of a multi-cycle path is less than a threshold fraction of a maximum multi-cycle path-normalized delay among the plurality of multi-cycle paths; or that a tightest multi-cycle path value is greater than a threshold multi-cycle path value; and pruning a node associated with the multi-cycle path from the cluster.

7. The method of claim 1, wherein each partition is a field programmable gate array (FPGA), a board comprising a plurality of FPGAs, or a unit comprising a plurality of boards, each board comprising a plurality of FPGAs.

8. A system comprising:

a memory storing instructions; and a processing device, coupled with the memory and to execute the instructions, the instructions when executed cause the processing device to:

receive a representation of a circuit design;

determine a partition from among a plurality of partitions of an emulation system to place a circuit portion of a plurality of circuit portions of the circuit design based on reducing a placement cost associated with the circuit portion, the circuit portion comprising a hybrid pin that behaves as a timing endpoint and a timing through-point along different paths in the circuit design, the placement cost associated with the circuit portion being computed based on a local cost computed based on propagating costs of fanin clusters for which the hybrid pin acts as a timing through-point; and implement the circuit portion in the partition of the plurality of partitions of the emulation system to emulate a circuit in accordance with the circuit design.

9. The system of claim 8, wherein the memory further stores instructions that, when executed by the processing device, cause the processing device to:

compute a cost of placing the circuit portion in each of the plurality of partitions based on the costs of placing a plurality of fanin circuit portions to the circuit portion in the plurality of partitions, wherein the cost is computed based on a plurality of costs of placing all of the fanin circuit portions to the circuit portion in the plurality of partitions.

10. The system of claim 9, wherein the memory further stores instructions that, when executed by the processing device, cause the processing device to compute a propagating cost based on a plurality of costs of placing only fanin circuit portions where the hybrid pin is a timing through-point in the plurality of partitions.

11. The system of claim 8, wherein the memory further stores instructions that, when executed by the processing device, cause the processing device to:

detect a topological loop through the hybrid pin in the circuit design;

create a movable virtual endpoint at a terminating edge of the hybrid pin; and break the topological loop at the terminating edge.

12. The system of claim 11, wherein the instructions for determining the partition from among the plurality of partitions further comprise instructions to backtrace from a timing endpoint of a timing graph based on timing arcs through the circuit design, and wherein the memory further stores instructions that, when executed by the processing device, cause the processing device to:

generate solutions for the movable virtual endpoint corresponding to the plurality of partitions; and select one or more solutions corresponding to one or more partitions in which the hybrid pin is placed during the backtrace.

13. The system of claim 8, wherein the memory further stores instructions that, when executed by the processing device, cause the processing device to:

group combinational logic portions of the circuit design into clusters corresponding to the circuit portions of the circuit design; and construct a timing graph based on timing arcs through the clusters, wherein the instructions to determine one or more partitions from among the plurality of partitions of an emulation system to place a circuit portion of the circuit design comprise instructions that, when executed by the processing device, cause the processing device to compute a placement cost associated with the cluster based on the timing graph.

14. The system of claim 8, wherein each partition is a field programmable gate array (FPGA), a board comprising a plurality of FPGAs, or a unit comprising a plurality of boards, each board comprising a plurality of FPGAs.

15. A non-transitory computer readable medium comprising stored instructions, which when executed by a processing device, cause the processing device to:

receive a representation of a circuit design;

group combinational logic portions of the circuit design into clusters corresponding to circuit portions of the circuit design;

construct a timing graph based on timing arcs through the clusters;

determine a partition from among a plurality of partitions of an emulation system to place a cluster of the clusters of the circuit design based on reducing a placement cost associated with the cluster, a circuit portion corresponding to the cluster comprising a hybrid pin that behaves as a timing endpoint and a timing through-point along different paths in the circuit design;

detect a topological loop through the hybrid pin in the circuit design;

create a movable virtual endpoint at a terminating edge of the hybrid pin;

break the topological loop at the terminating edge; and place the circuit portion corresponding to the cluster in the partition of the plurality of partitions of the emulation system to emulate a circuit in accordance with the circuit design.

16. The non-transitory computer readable medium of claim 15, further comprising stored instructions, which when executed by the processing device, cause the processing device to compute a cost of placing the cluster in each of the plurality of partitions based on the costs of placing a plurality of fanin clusters to the cluster in the plurality of partitions.

17. The non-transitory computer readable medium of claim 16, wherein the non-transitory computer readable medium further comprises stored instructions, which when executed by the processing device, cause the processing device to compute, for each cluster:

a propagating cost computed based on propagating costs of fanin clusters for which the hybrid pin acts as a timing through-point; and a local cost computed based on propagating costs of all of the fanin clusters, and wherein the placement cost associated with the cluster is computed based on the local cost.

18. The non-transitory computer readable medium of claim 15, wherein the instructions for determining the partition from among the plurality of partitions further comprise instructions to backtrace from a timing endpoint of the timing graph, and wherein the non-transitory computer readable medium further stores instructions that, when executed by the processing device, cause the processing device to:

generate solutions for the movable virtual endpoint corresponding to the plurality of partitions; and select one or more solutions corresponding to one or more partitions in which the hybrid pin is placed during the backtrace.

19. The non-transitory computer readable medium of claim 15, wherein a cluster corresponding to the circuit portion comprises a plurality of output nodes, and wherein the non-transitory computer readable medium further comprises stored instructions, which when executed by the processing device, cause the processing device to:

determine a transitive fanin cone of the output node, the transitive fanin cone comprising combinational logic elements of the cluster; and replicate the output node and the transitive fanin cone of the output node in the partition, without replicating combinational logic elements of the cluster that are not in the transitive fanin cone of the output node in the partition.

* * * * *